US007687327B2

(12) United States Patent
Cleeves et al.

(10) Patent No.: US 7,687,327 B2
(45) Date of Patent: Mar. 30, 2010

(54) METHODS FOR MANUFACTURING RFID TAGS AND STRUCTURES FORMED THEREFROM

(75) Inventors: James Montague Cleeves, Redwood City, CA (US); J. Devin MacKenzie, San Carlos, CA (US); Arvind Kamath, Mountain View, CA (US)

(73) Assignee: Kovio, Inc,, Milpitas, CA (US)

( * ) Notice: Subject to any disclaimer, the term of this patent is extended or adjusted under 35 U.S.C. 154(b) by 644 days.

(21) Appl. No.: 11/452,108

(22) Filed: Jun. 12, 2006

(65) Prior Publication Data
US 2007/0007342 A1   Jan. 11, 2007

Related U.S. Application Data

(60) Provisional application No. 60/697,599, filed on Jul. 8, 2005.

(51) Int. Cl.
*H01L 21/00* (2006.01)

(52) U.S. Cl. .................... 438/149; 438/190; 438/237; 257/E21.35

(58) Field of Classification Search ............. 438/142, 438/149, 237, 190; 257/E25.01, E21.35
See application file for complete search history.

(56) References Cited

U.S. PATENT DOCUMENTS

| 4,223,830 A | 9/1980 | Walton |
| 4,666,735 A | 5/1987 | Hoover et al. |
| 5,218,189 A | 6/1993 | Hutchinson |
| 5,510,769 A | 4/1996 | Kajfez et al. |
| 5,625,341 A | 4/1997 | Giles et al. |

(Continued)

FOREIGN PATENT DOCUMENTS

EP   1 087 428 A1   3/2001

(Continued)

OTHER PUBLICATIONS

U.S. Appl. No. 10/885,285, filed Jul. 6, 2004, Mackenzie et al.

(Continued)

*Primary Examiner*—Chandra Chaudhari
*Assistant Examiner*—Julia Slutsker
(74) *Attorney, Agent, or Firm*—The Law Offices of Andrew D. Fortney; Andrew D. Fortney; Sharon E. Brown Turner

(57) ABSTRACT

Radio frequency identification (RFID) tags and processes for manufacturing the same. The RFID device generally includes (1) a metal antenna and/or inductor; (2) a dielectric layer thereon, to support and insulate integrated circuitry from the metal antenna and/or inductor; (3) a plurality of diodes and a plurality of transistors on the dielectric layer, the diodes having at least one layer in common with the transistors; and (4) a plurality of capacitors in electrical communication with the metal antenna and/or inductor and at least some of the diodes, the plurality of capacitors having at least one layer in common with the plurality of diodes and/or with contacts to the diodes and transistors. The method preferably integrates liquid silicon-containing ink deposition into a cost effective, integrated manufacturing process for the manufacture of RFID circuits. Furthermore, the present RFID tags generally provide higher performance (e.g., improved electrical characteristics) as compared to tags containing organic electronic devices.

33 Claims, 12 Drawing Sheets

U.S. PATENT DOCUMENTS

| | | |
|---|---|---|
| 5,841,350 A | 11/1998 | Appalucci et al. |
| 5,989,944 A | 11/1999 | Yoon |
| 6,091,607 A | 7/2000 | McKeown et al. |
| 6,200,508 B1 | 3/2001 | Jacobson et al. |
| 6,294,401 B1 | 9/2001 | Jacobson et al. |
| 6,348,295 B1 | 2/2002 | Griffith et al. |
| 6,356,197 B1 | 3/2002 | Patterson et al. |
| 6,400,271 B1 | 6/2002 | Davies et al. |
| 6,413,790 B1 | 7/2002 | Duthaler et al. |
| 6,509,217 B1 | 1/2003 | Reddy |
| 6,511,870 B2 | 1/2003 | Chen et al. |
| 6,514,801 B1 | 2/2003 | Yudasaka et al. |
| 6,719,916 B2 | 4/2004 | Dubowski et al. |
| 6,855,378 B1 | 2/2005 | Narang |
| 6,884,700 B2 | 4/2005 | Aoki et al. |
| 7,294,449 B1 | 11/2007 | Gudeman et al. |
| 7,422,708 B2 | 9/2008 | Kunze et al. |
| 2001/0040507 A1 | 11/2001 | Eckstein et al. |
| 2002/0163434 A1 | 11/2002 | Burke |
| 2002/0179906 A1 * | 12/2002 | Yudasaka et al. ............... 257/57 |
| 2004/0053431 A1 | 3/2004 | Chang et al. |
| 2004/0164302 A1 | 8/2004 | Arai et al. |
| 2004/0248429 A1 | 12/2004 | Aoki |
| 2005/0133790 A1 | 6/2005 | Kato |
| 2005/0134435 A1 | 6/2005 | Koyama et al. |
| 2005/0134463 A1 | 6/2005 | Yamazaki et al. |
| 2005/0148121 A1 * | 7/2005 | Yamazaki et al. ........... 438/149 |
| 2005/0168339 A1 | 8/2005 | Arai et al. |
| 2005/0181566 A1 | 8/2005 | Machida et al. |
| 2005/0194645 A1 | 9/2005 | Yamaguchi et al. |
| 2005/0210302 A1 | 9/2005 | Kato et al. |
| 2005/0214688 A1 | 9/2005 | Yamamoto et al. |
| 2007/0128760 A1 | 6/2007 | Subramanian et al. |

FOREIGN PATENT DOCUMENTS

| | | |
|---|---|---|
| JP | 9-237927 A | 9/1997 |

OTHER PUBLICATIONS

U.S. Appl. No. 11/084,448, filed Mar. 18, 2005, Cleeves.

U.S. Appl. No. 11/203,563, filed Aug. 11, 2005, Choi et al.

J.H. Lee et al.; The Improvement of Reliability In the Poly-SI TFTs Employing Laser Irradiation on Gata Oxide; AM-LCD '03, pp. 169 et seq. (TFTp3-3).

Hongmal Wang et al.; High Frequency Performance of Large-Grain Polyslllicon-on-Insulator MOSFETs; IEEE Transactions on Electron Devices, vol. 48, No. 7, Jul. 2001.

J. Davin MacKenzie et al.; MOS Electronic Article Survaillance, RF and/or RF Identification Tag/Deulea, and Methods for Making and Using the Same:U.S. Appl. No. 10/885,283, filed Jul. 6, 2004.

James Montague Cleeves; MOS Transistor with Self-Aligned Source and Drain, and Method for Making the Same; U.S. Appl. No. 11/084,448, filed Mar. 18, 2005.

Criswell Choi; MOS Transistor with Laser-Patterned Metal Gate, and Method for Making the Same; U.S. Appl. No. 11/203,563, filed Aug. 11, 2005.

J. Davin MacKenzie et al; RF and/or RF Identification Tag/Device Having an Integrated Interpoaer, and Methods for Making and Using the Same; U.S. Appl. No. 11/243,460, filed Oct. 3, 2005.

Tatsuro Beppu, Shuji Hayase, Toshiro Hiraoka, Atsushi Kamata and Kenji Sano; "Semiconductor Film Forming Method and Solar Cell Manufacturing Method"; Patent Abstracts of Japan; Publication No. 09-237927; Publication Date: Sep. 9, 1997; Japan Patent Office, Japan.

* cited by examiner

1. IJ SOG
2. cure
3. clean
4. IJ N-
5. furnace crystallize and oxidize
6. sputter Aluminum
7. Gate mask
8. Gate etch
9. Photo mask
10. N+ implant
11. clean
12. Photo mask
13. P+ implant
14. clean
15. laser activate
16. IJ SOG
17. Photo mask
18. wet etch SOG
19. clean
20. sputter Aluminum
21. Photo mask
22. wet etch Al
23. clean
24. deposit passivation

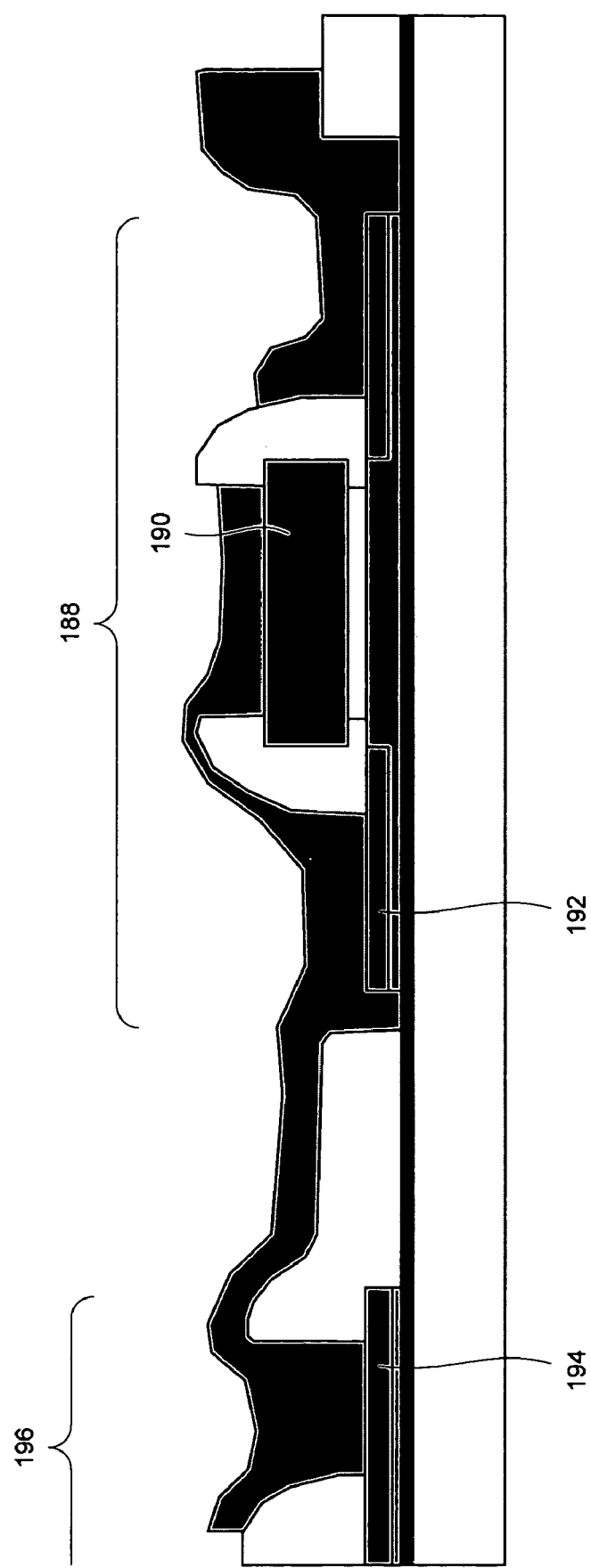

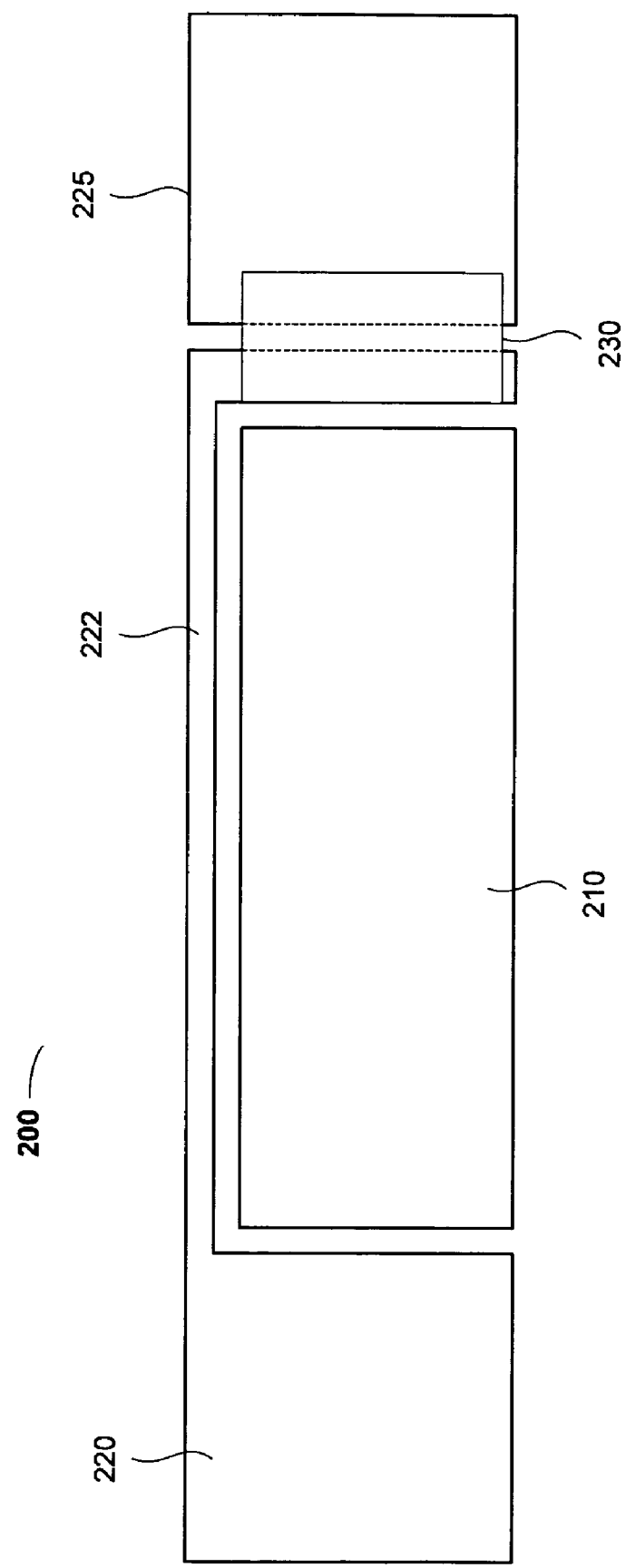

METHODS FOR MANUFACTURING RFID TAGS AND STRUCTURES FORMED THEREFROM

RELATED APPLICATIONS

This application claims the benefit of U.S. Provisional Application No. 60/697,599, filed Jul. 8, 2005, incorporated herein by reference in its entirety.

FIELD OF THE INVENTION

The present invention generally relates to the field of radio frequency identification (RFID) tags and processes for manufacturing the same.

BACKGROUND OF THE INVENTION

A RFID tag or electronic barcode is generally used to provide identification or other information about a product to which the tag is attached through a wireless link to a reader system which captures this information and passes it on, typically in digital form, to various database, decision-making, or other electronic tracking systems. This information is gathered wirelessly by the RF transmit and receive components of the reader device which typically broadcasts a carrier frequency which can provide RF power, clock signal, and modulation-encoded commands.

In the case of passive tags, which are generally most interesting for low cost tags as they avoid on-tag power source costs, the carrier frequency signal provides the RF energy to power the chip. Clock signal recovery and synchronization are also important system attributes/functions which are usually derived from the reader→tag RF signals. The clock frequency can define the operating frequency and data communication rates from tag to reader and from reader to tag.

At HF, due to frequency bandwidth concerns imposed by national and international regulations, the clock signal is often derived by the tag circuit by dividing down the carrier frequency. At UHF frequencies and above, clock signals are typically derived from subcarrier frequency modulations on the carrier frequency. This is due to a number of reasons. Around 869 MHz and 915 MHz, bandwidth constraints are less restrictive than at HF frequencies in Europe and the U.S., respectively. This allows for the addition of subcarrier modulation of a sufficient frequency to allow high speed data communication between reader and tag. Also, dividing down the carrier frequency directly requires GHz-speed clocking circuits and their associated energy losses. Instead, a $10^4$-$10^5$ Hz sub-carrier signal can be demodulated or modulated with simple, lower loss subcircuits that can be made with thin film transistors (TFTs), diodes, capacitors, inductors and resistors.

Communication from tag to reader generally occurs through impedance modulation. In the HF range and lower, the tag is usually in the near field, inductive-coupling range, significantly less than the free space wavelength of the RF carrier. In this case, there is a direct inductive coupling between the tag, which typically has a resonant inductor-capacitor (LC) loop tuned at or near the carrier frequency, and reader as in the primary and secondary coils of a simple inductor-based AC transformer. Modulation of the resonance characteristics of the LC loop in the tag, typically through a variable resistive load (which can be provided by a transistor), results in a detectable impedance change in the reader front end circuit. The tag circuitry serially reads out data via this modulation signal to the reader.

At UHF frequencies, the reader to tag distance is generally longer, and the carrier wavelength is shorter. Due to this, the RF link between the two falls in the range of electromagnetic wave propagation physics, as is typically the case in radar, AM/FM radio or cellular phone technology. In this case, the tag links to the reader via a reflected backscatter signal. By modulating the impedance of the tag's antenna(e), the amount of power or the phase or frequency of the signal reflected back to the reader can be changed, and a time-varying signal can be encoded with this form of modulation. This modulation can be performed resistively, as with a transistor, or through the use of varactors that modulate the imaginary part of the tag antennae's impedance.

On a more basic level, RFID tag circuitry generally performs some or all of the following functions:
1. Absorption of RF energy from the reader field.
2. Conversion of this RF signal into a DC signal that powers the chip.
3. Demodulation of incoming clock, timing and/or command signals available in the RF signal from the reader.
4. State machine decision making and control logic that acts on incoming or preset instructions.
5. Counter- or register-based reading of data in digital form from a memory array or other source (example: output of a sensor).
6. Storage elements (e.g., memory) that store the ID code or other information that is to be read out to the reader and/or used for security authentication.
7. Modulation of coded data, timing signals or other commands back to the tag antenna(e) for transmission to the tag reader

SUMMARY OF THE INVENTION

Embodiments of the present invention relate to a radio frequency identification (RFID) device and methods for making the same and for making integrated circuitry for the same.

The method generally comprises (a) forming, from a first silane ink, at least one first semiconductor layer element on a first surface of a dielectric layer, the dielectric layer on an electrically active substrate and the first semiconductor layer element comprising at least one of a capacitor plate, a transistor channel region, and a first diode layer; (b) forming, from a second silane ink, at least one second semiconductor layer element different from the first semiconductor layer element on at least one of the first semiconductor layer element(s) and the first surface of the dielectric layer, the second semiconductor layer element comprising at least one of a second diode layer, transistor source/drain terminals (when the first silane ink forms the transistor channel region), and the transistor channel region (when the first silane ink does not form the transistor channel region); and (c) forming at least one metal element on or over at least one of the first semiconductor layer element(s) and the second semiconductor layer element(s), the metal element comprising at least one of a metal contact, a second capacitor plate and a metal gate (when the second silane ink does not form the transistor source/drain terminals).

Alternatively, the method may comprise depositing (e.g., printing or inkjetting) an N+ or P+ doped silane ink on the dielectric layer and/or active substrate; crystallizing the doped silicon film resulting from the doped silane ink, depositing (e.g., printing or inkjetting) an N– or P– doped silane ink in (1) regions for forming transistors and (2) on the N+ or P+ doped silane ink in regions that will be made into vertical diodes; (optionally) patterning one or more of the films formed from the doped silane inks into isolated transistor regions and mesa regions for diodes; growing or depositing an oxide film that may function as a capacitor dielectric (e.g., over heavily doped regions) and/or a gate dielectric (e.g., over lightly doped and/or transistor channel regions); depositing and/or patterning a gate conductor; selectively doping source and drain regions; activating the source and drain regions; depositing a dielectric film in which contact holes are formed over both transistor and diode regions; (optionally) forming a contact layer (e.g., a silicide) in these contact openings; and depositing and patterning a conductor in direct or indirect contact with the transistor and diode regions to form interconnect wiring. The resultant structure includes capacitors, diodes and transistors on a single substrate, without necessarily using a single photolithography mask.

The RFID device generally comprises (1) a metal antenna and/or inductor; (2) an optional interposer strap attached to the antenna or inductor which is at least partly electrically conducting; (3) a dielectric layer thereon, configured to support and insulate integrated circuitry from the metal antenna and/or inductor; (4) a plurality of diodes and a plurality of transistors on the dielectric layer, the diodes having at least one layer in common with the transistors; and (5) a plurality of capacitors in electrical communication with the metal antenna and/or inductor and at least some of the diodes, the plurality of capacitors having at least one layer in common with the plurality of diodes and/or at least one metal layer in common with contacts to the diodes and transistors.

The present invention provides a way to integrate liquid Si deposition into a cost effective, integrated manufacturing process for the manufacture of RFID circuits. Many of the active semiconductor components, including diodes and transistors, are thin film-based. Based on the demonstrated performance of Si ink-derived semiconductor films, in terms of such parameters as mobility, doping/carrier concentration, and other parameters, functional RFID tags in the LF, HF, UHF, and microwave carrier frequency regimes are possible. The present thin film approach utilizing Si ink is attractive as this can be done at relatively low cost per unit area which further enables low cost, relatively large die which can be inexpensively integrated directly on antennae and/or inexpensively and quickly attached to antennae using processes such as conductive adhesive and crimp bonding. Furthermore, the present RFID tags generally provide higher performance (e.g., improved electrical characteristics) as compared to tags containing organic electronic devices.

Although the invention is not necessarily limited to any one or any combination of the following, novel concepts disclosed herein include:

Forming some or all of the components necessary for a commercially acceptable RFID tag/device by coating and/or selectively depositing silicon (in the present case, from a liquid source);

Integration of all of the components necessary for a commercially acceptable RFID tag/device into a relatively low step count process flow;

Simultaneous growth of oxide on both lightly doped transistor channel regions and heavily doped capacitor plate regions to yield both transistor gate oxide and capacitor dielectric, respectively;

Removal of substrate metal from below some of the active circuit elements that have performance parameters adversely affected by parasitic capacitance;

Selection of a stainless steel substrate sealed and/or coated with an insulator (e.g., printed or conventionally deposited spin-on glass [SOG], or a CVD oxide and/or nitride), allowing the use of both furnace based crystallization as well as thermal oxidation of Si for the formation of high mobility and /or high conductivity silicon and gate oxide(s), respectively;

Elongated (lateral) contacts to the lower electrode of the diode, placed relatively close to an elongated active region, thereby limiting the series resistance between the metallic contacts to the diode, allowing for a simpler and lower cost overall integration;

A heavily doped bottom contact/interconnect layer for diodes, to eliminate the need for an additional metal interconnect layer and enable simultaneous growth of a capacitor dielectric layer (the diodes can optionally be either p- or n-/metal Schottky diodes or p/n diodes);

Heavily doped silane ink printed or deposited directly on stainless steel or over a barrier metal to form the bottom contact of a capacitor;

Encapsulating and/or protecting the metal substrate (e.g., stainless steel) with a spin on glass (SOG) or other insulating layer, including on the backside of the substrate, during oxidation or other processing;

protecting the metal substrate during oxidation or other processing with silicon and/or patterned SOG regions, including active and inactive regions of the frontside and backside of the substrate (and in the case of Si regions, this allows for an electrical connection through to the metal substrate as well, which may be assisted by n+ or p+ doping);

Covering the entire top surface of the metal substrate with oxide (except where it is covered by Si) to limit contamination by the metal substrate during subsequent manufacturing/processing steps, primarily sputter etching;

Capacitors or capacitor electrodes on an oxide film, either over a foil substrate (e.g., stainless steel or aluminum) or in a region without foil, such that they can be isolated from the dipoles (antennae) and have relatively low parasitic capacitance;

A single metal interconnect layer for many different components of the circuit (metal substrate dipole contact, gate conductor contact for interconnect and capacitors, Si contact for diodes, and contacts to transistor source/drain terminals), reducing the total number of metal layers (and therefore the process cost, although one should carefully design a layout, integration/manufacturing process and via/interlayer dielectric [ILD]/metallization process that provide a suitable circuit topography and that are compatible with each other; e.g., in the case of a layout that includes formation of Schottky contacts, a common metallization such as Ti/Al may serve as both interconnect and the Schottky metal where it contacts undoped or lightly doped semiconductor layers); and A self-aligned gate process using a silane ink to get small channel length, low capacitance, low foot print, high speed devices for logic and RF operation. A self-aligned process may use implantation, solid source doping (e.g., from a SOG), or a doped silane as the source and drain doping source, all of which may be self-aligned across the gate.

These and other advantages of the present invention will become readily apparent from the detailed description of preferred embodiments below.

BRIEF DESCRIPTION OF THE DRAWINGS

FIG. 4 shows a cross-section of an exemplary diode-wired transistor manufactured by the exemplary process flow of FIG. 3.

FIG. 5 is a layout diagram showing an embodiment of the present device.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

The invention, in its various aspects, will be explained in greater detail below with regard to exemplary embodiments.

An Exemplary Process for Manufacturing RFID Tags

Figure 1:
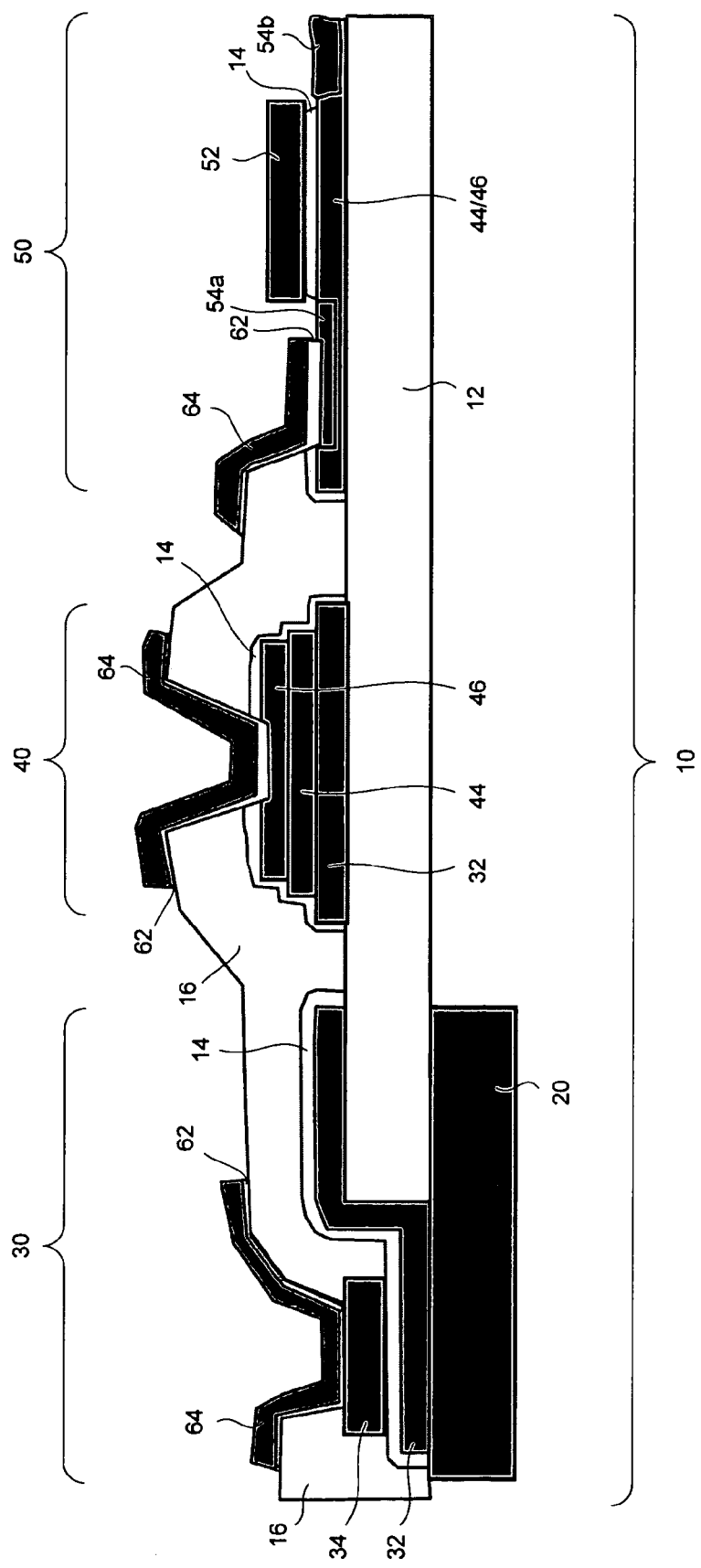
FIG. 1 is a cross-sectional diagram showing structures of an exemplary device made by one embodiment of the present manufacturing process.

FIG. 1 shows a first exemplary RFID tag 10, including antenna 20, capacitor 30 coupled thereto, diode 40 and transistor 50. An exemplary process for making RFID tag 10 shall be explained below. The exemplary cross-section for tag 10 and a specific process flow are also shown on page 37 of U.S. Provisional Patent Application No. 60/697,599, filed Jul. 8, 2005, and a version of that process flow adapted to make a p/n diode (and corresponding tag cross-section) are shown on page 38 of U.S. Provisional Patent Application No. 60/697, 599.

First, a spin on glass (SOG) layer 12 may be deposited onto a conventional metal foil (e.g., see U.S. patent application Ser. No. 10/885,283, filed Jul. 6, 2004, entitled "MOS Electronic Article Surveillance, RF and/or RF Identification Tag/ Device, and Methods for Making and Using the Same," the relevant portions of which are incorporated herein by reference). In the present case, an electrically active substrate generally refers to a substrate having one or more predetermined electrical properties and/or functions, such as signal transmission and/or reception (particularly at or in a predetermined frequency range), charge storage (e.g., as one or more capacitor electrodes), signal switching, rectification and/or filtering, etc. Preferably, the substrate has one or more electrically conducting and/or semiconducting properties. Depositing may comprise conventional spin-coating, printing (e.g., inkjet ["IJ"] printing), blade coating, dip coating, meniscus coating, slot coating, gravure printing, or spray coating a SOG ink composition comprising conventional one or more SOG components, one or more conventional solvents for conventional SOG compositions, and one or more conventional surfactants, tension reducing agents, binders and/or thickening agents. Typically, the SOG layer 12 depositing step is followed by conventional curing and cleaning steps.

Next, a heavily doped semiconductor layer 32 is deposited (e.g., by printing or inkjetting a silicon-containing ink, such as an n-doped silane; see U.S. patent application Nos. 10/950, 373, 10/949,013, and 10/956,714, respectively filed on Sep. 24, 2004, Sep. 24, 2004, and Oct. 1, 2004, the relevant portions of each of which are incorporated herein by reference) onto regions of the SOG layer 12 and foil corresponding to capacitor 30 (and at least partly in contact with subsequently formed antenna 20 ) and diode 40. The silicon-containing ink may additionally or alternatively comprise one or more semiconductor compounds (e.g., a linear, branched, cyclic or polycyclic silicon precursor compound that provides a silicon-containing film upon removal of the groups [covalently] bound thereto by conventional processing) and/or one or more semiconductor nanoparticles (e.g., of a Group IV element such as Si, Ge, SiGe, etc.). Alternatively, the ink may comprise or include one or more semiconductor compounds (such an organic semiconductor or a semiconductor precursor compound that provides a semiconductor film [such as GaAs, CdSe, CdTe, ZnO, ZnS, etc.] upon removal of ligands and/or covalently-bound groups by conventional processing), and/or one or more semiconductor nanoparticles (e.g., of a semiconductor material such as GaAs, chalcogenide semiconductors such as ZnO, ZnS, CdSe, CdTe, etc.) The ink generally includes a solvent in which the above nanoparticles and/or compounds are soluble or suspendable (e.g., a $C_6$-$C_{20}$ branched or unbranched alkane that may be substituted with one or more halogens, a $C_6$-$C_{20}$ branched or unbranched alkene, a $C_2$-$C_6$ branched or unbranched alkene substituted with one or more halogens, a $C_5$-$C_{20}$ cycloalkane such as cyclohexane, cyclooctane or decalin, a $C_6$-$C_{10}$ aromatic solvent such a toluene, xylene, tetralin, a di-$C_{1\text{-}C10}$ alkyl ether having a total of at least 4 carbon atoms, and/or a $C_4$-$C_{10}$ cyclic alkyl ether such as tetrahydrofuran or dioxane, etc.; see, e.g., U.S. patent application Nos. 10/616,147, filed Jul. 8, 2003, the relevant portions of which are incorporated herein by reference). The ink may further comprise a surface tension reducing agent, a surfactant, a binder and/or a thickening agent, but may advantageously omit such additives or agents.

Currently, for Schottky diodes, the method comprises forming or depositing a heavily doped semiconductor layer first, before formation of other functional layers in the Schottky diode. A connection to diode 40 may be formed from capacitor 30, for example, by forming, printing or patterning layer 32 such that a strap between the diode 40 and capacitor 30 is formed; alternatively, one may make the connection in metal. To the extent heavily doped layer 32 comprises an amorphous Group IVA element-containing material (e.g., Si and/or Ge), one preferably crystallizes the heavily doped layer 32 before subsequently depositing the next layer. Thereafter, one or more lightly doped semiconductor layers 44/46 are similarly deposited or printed onto the substrate at regions corresponding to diode 40 and transistor 50. Lightly doped (e.g., $N^-$) semiconductor (silicon or [cyclo]silane) ink compositions are also disclosed in U.S. patent application Nos. 10/950,373, 10/949,013, and 10/956,714, $P^+$ and $P^-$ layers may be formed by similar printing steps, generally performed immediately before or immediately after the $N^+$ and $N^-$ regions. The semiconductor regions are then crystallized (and preferably, some or substantially all of the dopant therein activated) by furnace annealing or laser crystallization, then patterned into active islands. A thin oxide surface layer 14 is grown thereon (generally by heating or laser irradiating the structure in an oxidizing atmosphere, such as oxygen). This oxidizing step forms both a gate dielectric and a capacitor dielectric. Alternatively, the gate dielectric and capacitor dielectric may be formed by conventional deposition and patterning of a corresponding dielectric material.

A doped or undoped liquid-phase silicon-containing (e.g., silane) composition is then deposited over approximately the middle of transistor region 50 to define the gate 52 of the transistor 50 and upper plate 34 of capacitor 30 (see, e.g., U.S. patent application Ser. No. 10/616,147 [filed on Jul. 8, 2003], Ser. No. 10/789,317 [filed on Feb. 27, 2004], Ser. Nos. 10/950,373, 10/949,013 and/or Ser. No. 10/956,714). Thus, in one embodiment, depositing the silicon composition comprises printing (e.g., inkjetting) a silane ink. If a doped silane composition is used, multiple layers may be formed. If an undoped silane composition is used, a single layer may be formed, and a layer of metal (such as cobalt [Co] or nickel [Ni] may be plated (or selectively grown or deposited) thereon (generally after formation of dielectric layer 16, e.g., by high-resolution patterning, such conventional photolithography or laser lithography/patterning; see paragraph [0034] below). Subsequent heat treatment (at a temperature sufficient to crystallize and/or form silicide from the gate material) generally forms gate 52 and capacitor plate 34, which in many cases, can be used without further modification.

However, in one embodiment, a gate metal layer may be photolithographically defined or laser patterned (preferably by [i] coating a deposited metal layer with a thermal resist or other conventional resist containing an IR dye and [ii] selectively irradiating the resist with a laser; see, e.g., U.S. patent application Ser. Nos. 11/084,448 and 11/203,563, filed on Mar. 18, 2005 and Aug. 11, 2005, respectively, the relevant portions of which are incorporated herein by reference) and excess gate metal material removed by etching (preferably wet etching). Alternatively, the gate metal layer may be defined by other lithographic means including embossing, imprinting or other high resolution patterning technology.

After conventional stripping (e.g., of photoresist, to the extent necessary and/or desired) and/or cleaning, another SOG layer 16 may be printed or coated onto the structure. If printed, one or more of capacitor 30, diode 40 and/or transistor 50 (preferably at least transistor 50) may remain exposed. If coated, portions of SOG layer 16 above capacitor plate 34, diode layer 46 and transistor 50 may be removed photolithographically (following conventional SOG curing, by coating with a photoresist, irradiating the photoresist through a mask, etching [preferably wet etching], then stripping the photoresist and cleaning the surface of the device) or by a laser-resist process as described in U.S. patent application Ser. No. 11/203,563, filed on Aug. 11, 2005, the relevant portions of which are incorporated herein by reference). Under appropriate conditions and using known etchant compositions, the etching step may also remove the exposed thin oxide film 14, and optionally, a small amount (e.g., up to about 30 nm) of lightly doped polysilicon layer 44/46. Any such irradiation and etching steps will preferably expose the entire gate layer 52 and remove the SOG layer 16 from over portions of lightly doped semiconductor layer(s) 44/46 on both sides of gate layer 52 of sufficient dimensions to form heavily doped source and drain terminal layers thereon and conductive contacts thereto. If any part of thin oxide film 14 remains exposed, it is also removed by etching (and the resulting surface cleaned) prior to further processing.

At this point, a heavily doped semiconductor layer is printed or otherwise deposited on the exposed surfaces of transistor 50 (e.g., lightly doped polysilicon layer 44/46 and gate layer 52), thermally cured, laser irradiated, and the non-crystallized portions thereof removed by selective wet etching, to form source and drain contact layers 54a-b, which may be self-aligned to gate layer 52 (see, e.g., U.S. patent application Ser. Nos. 11/084,448 and 11/203,563, filed on Mar. 18, 2005 and Aug. 11, 2005, respectively, the relevant portions of which are incorporated herein by reference). Alternatively, dopant atoms may be introduced into or onto the exposed Si surfaces via implantation, plasma deposition, laser decomposition, vapor deposition or other technique, after which the doped Si is converted into source and drain contacts by annealing. As described above, N+ and P+regions may be deposited separately (but cured, laser irradiated and wet etched in the same processing steps).

Contacts (and a first level of metallization) may be formed by metallization processing conventionally used in the integrated circuit/semiconductor manufacturing industries (e.g., sputter a relatively thin barrier and/or adhesive layer 62 such as Ti, TiN or a TiN-on-Ti bilayer, then a relatively thick bulk conductor layer 64, such as Al or Al—Cu alloy (0.5-4 wt. % Cu, followed by conventional photolithographic definition of contacts and metal lines that are subsequently etched [preferably wet etched using a conventional $NH_4OH/H_2O_2$ etch composition that selectively etches metals such as Al, TiN and Ti relative to a metal silicide). Alternatively, similar to gate layer 52, a layer of silicon or barrier metal 62 may be printed or otherwise deposited or formed on exposed surfaces of capacitor plate 34, diode layer 46 and transistor 50, and a conductive metal 64 selectively plated, deposited or printed thereon (optionally with subsequent thermal treatment or annealing to form a metal silicide when layer 62 consists essentially of silicon). Of course, contacts and/or metallization to gate layer 52 may be formed at the same time as the contacts and metallization to the capacitor and diode, generally in an area outside of the source and drain regions. The photoresist may then be conventionally stripped, and the device may be conventionally cleaned. Alternatively, the contacts and/or metallization may be patterned by a laser-resist process as described in U.S. application Ser. No. 11/203,563, filed on Aug. 11, 2005, the relevant portions of which are incorporated herein by reference) or a laser-based process as described in U.S. patent application Ser. No. 10/722,255, filed on Nov. 24, 2003, the relevant portions of which are incorporated herein by reference).

To complete the device, a SOG layer may be printed (e.g., by inkjetting) or blanket deposited (e.g., by conventional spin coating, blade coating, screen printing, dip coating, meniscus coating, slot coating, gravure printing, or spray coating) over the device (not shown in FIG. 1, but shown in FIG. 2 and discussed below). If an additional layer of metallization is desired, contact holes over predetermined locations in the metallization layer 62/64 may be conventionally formed in the SOG layer (or may remain following printing), and a second layer of metallization may be formed in the same manner as metallization layer 62/64. An uppermost cap or passivation layer (e.g., comprising a SOG layer) may then be formed over the entire device as described herein, cured, and (optionally) an encapsulant, support or adhesive may be laminated thereto.

The backside of the device (i.e., the metal foil or sheet from which antenna and/or inductor 20 is formed) or the interposer is then masked (e.g., with conventional photoresist, laser patterned resist, or printed resist/mask material [such as SOG]), etched (e.g., using a conventional metal wet etch), and cleaned to form antenna/inductor/interposer 20. Finally, an encapsulant (e.g., a conventional water-resistant or water-repellant encapsulant comprising a thermoplastic or thermoset resin; not shown in FIG. 1, but shown in FIG. 2 and discussed below) may be dispensed onto the etched backside of the device, thereby completing formation of the RF ID device 10.

Figure 2:
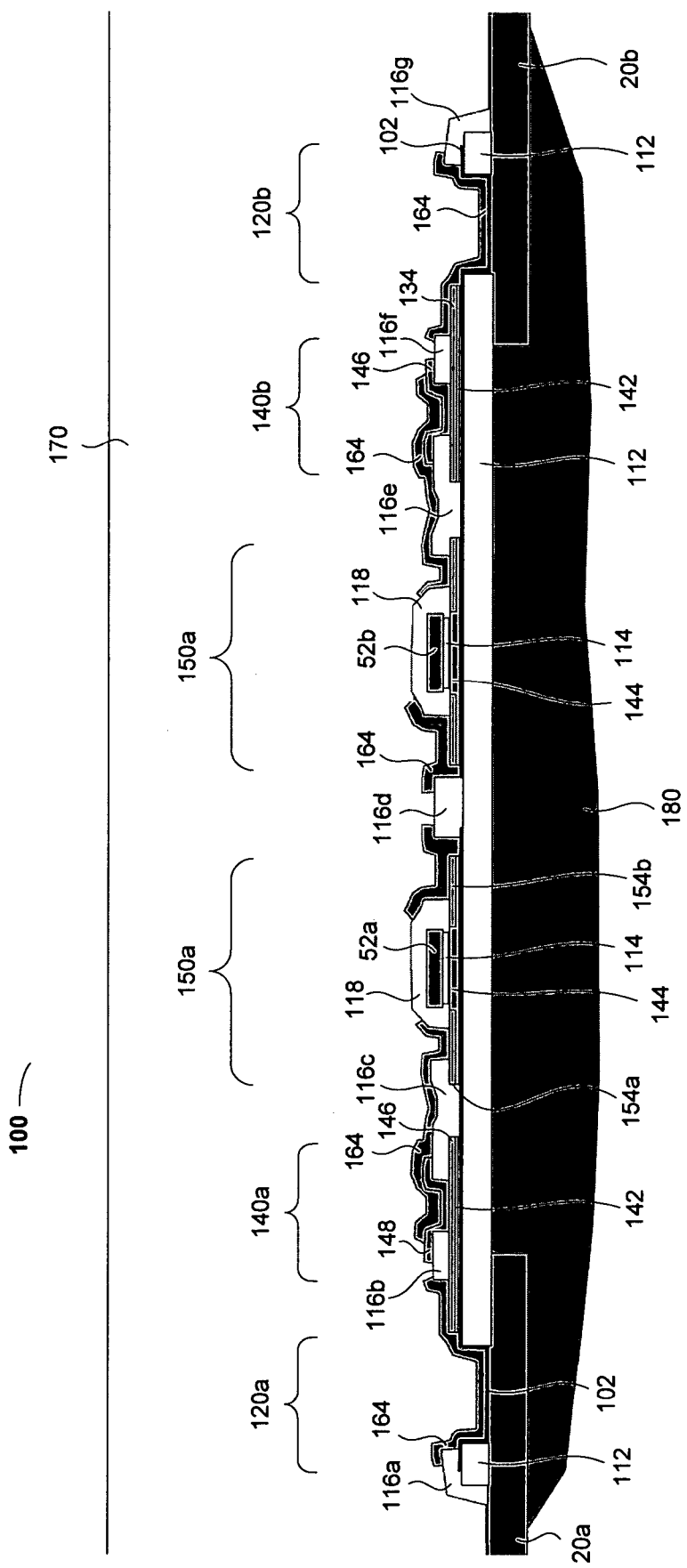
FIG. 2 is a cross-sectional diagram showing structures of another exemplary device made by another embodiment of the present manufacturing process.

FIG. 2 shows a cross-sectional view of a substantially completed, alternative device 100. Device 100 is, in some respects, a variation (e.g., a "dual dielectric" embodiment) of device 10 of FIG. 1. Device 100 includes a barrier dielectric 102 that allows for capacitors with low parasitics, as well as non-enclosed contacts for tighter packing density.

Referring now to FIG. 2, a thin, "high k" dielectric material 102 (e.g., $HfO_x$) may be printed or otherwise formed or deposited on dielectric 112 (e.g., from a sol-gel formulation). One or more lightly doped polysilicon layers may be formed or deposited (e.g., by printing or inkjetting) thereon similar to polysilicon layers 44 and 46 above, to form channel layer 144 for transistors 150a and 150b and (optionally) a base layer 142 for diodes 140a-b to be subsequently doped. Alternatively, any of the blanket-deposited or globally deposited silicon or metal layers (and optionally, printed silicon or metal layers) may be further defined by laser patterning ("laser expos[ing]" where a resist is used). Alternatively, the layers (such as, e.g., metal and/or silicon) may be patterned directly by "laser writ[ing]"; see, e.g., U.S. patent application Ser. No. 11/203,563, filed on Aug. 11, 2005, the relevant portions of which are incorporated herein by reference. These techniques may also be applied to the same layers in the exemplary process and device depicted in FIG. 1. Thereafter, a gate dielectric layer (e.g., 114) may be grown, a gate material printed or otherwise deposited thereon, and gates 152a and 152b formed in the same manner as dielectric layer 14 and gate 52 in FIG. 1. Subsequent etching of exposed oxide will remove oxide from the source and drain regions of transistors 150a-b and also any oxide formed on the polysilicon layer 142 for the diodes.

Thereafter, a heavily doped lower diode layer 146 and source and drain terminals 154a-b for transistors 150a and 150b are formed similar to source and drain terminals 54 or polysilicon layer 32 above. Thus, lower diode layer 146 and source and drain terminals 154a-b may be formed by ion implantation or by printing a heavily doped silane ink as discussed above. In one embodiment, lower diode layer 146 comprises an $N^+$-doped silicon layer. After crystallization and dopant activation (as described herein and elsewhere), a second SOG layer may be printed or otherwise formed thereon, and openings conventionally formed therein, to form interlayer dielectric (ILD) 116a-g and 118. A relatively thick, lightly doped polysilicon layer may be printed or deposited thereon (particularly in contact openings in diode regions 140a-b), similar to polysilicon layer 32 above, to form upper diode layer 148. When lower diode layer 146 comprises a heavily doped layer, polysilicon layer 148 may be lightly doped. In this embodiment, lower diode layer 146 and upper diode layer 148 have different dopant concentrations or densities (e.g., lower diode layer 146 may be $N^+$ doped, and upper diode layer 148 may be $N^-$ doped). In an alternative embodiment, lower diode layer 146 and upper diode layer 148 have different (or complementary) dopant types (e.g., lower diode layer 146 may be $N^+$ doped, and upper diode layer 148 may be $P^-$ doped with an optional $P^+$ doped layer on the surface). Thereafter, metallization layer 164 may be formed in substantially the same manner as metallization 62/64 above to form upper plates for capacitors 120a-b and contacts to source, drain and gate terminals of transistors 150a-b and diodes 140a-b.

An uppermost cap or passivation layer 170 (e.g., comprising a SOG layer) may then be formed over the entire device by conventional deposition (e.g., spin-coating, spray-coating, inkjet printing, etc.) techniques, then cured. After forming an antenna, inductor or resonator (electrically coupled inductor and capacitor) 20, an encapsulant, support or adhesive 180 may be laminated thereto. Optionally, one may form two, substantially identical inductors 20a-b. The device 100 is otherwise made as described above for exemplary device 10 of FIG. 1. A further variant of this process may use the above mentioned steps, with the omission of the vertical diode components, to form RFID circuits using diode-wired transistors (e.g., formed by shorting the source to the gate) as the diodes for DC power generation and signal demodulation.

Figure 3:
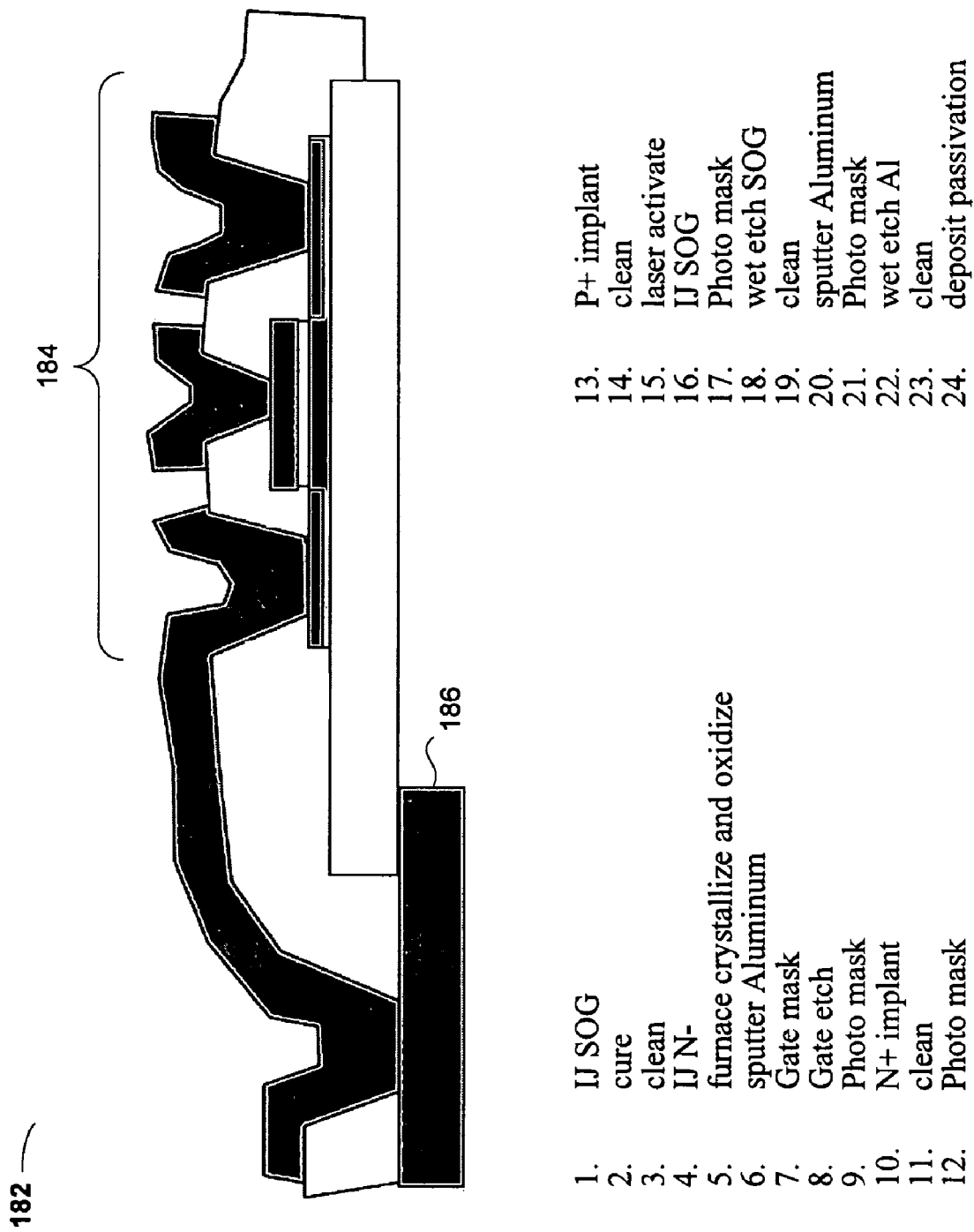
FIG. 3 shows an exemplary device cross-section and process flow for making diode- and capacitor-wired transistors according to the present invention.

FIG. 3 shows a cross-section 182 of an exemplary device 184 connected to antenna/inductor 186 and a process flow for making diode- and capacitor-wired transistors. FIG. 4 shows an exemplary diode-wired device 188 with a gate 190 shorted to a source or drain terminal 192, and terminal 192 wired to a source or drain terminal (or lower diode layer/terminal) 194 of an adjacent device 196. Capacitor-wired transistors can be similarly formed, with source and drain terminals wired to each other. In the flow of FIG. 3, a transistor is wired conventionally, and a capacitor is made by shorting the source and drain together as one terminal and using the gate as the other terminal. Notably, the process flow of FIG. 3 is considerably shorter and contains fewer steps than the process flows for making the devices of FIGS. 1-2. In fact, the process flow of FIG. 3 may contain only one step that involves printing a silane ink (although one may use be two silane ink printing steps, one for n-channel devices and one for p-channel devices, for complementary MOS transistors). Such devices (including the diode- and capacitor-wired transistors) show performance characteristics suitable for use in 13.56 MHz RFID tags. Naturally, the wiring for shorting (i) gate and (ii) source or drain contacts together (as well as wiring for shorting source and drain contacts together) is not shown in the cross section of FIG. 3, and would be located elsewhere in the transistor layout, either in front of or behind the plane of the page. Notably, the flow of FIG. 3 shows that a single inkjetted silane layer can be formed (step 4), and this silane layer can be crystallized and oxidized in the same processing step in a furnace (step 5). Separate ion implantation steps (steps 10 and 13) are then used to form NMOS and PMOS transistors/devices.

An Exemplary RFID Device

In another aspect, the present invention concerns a layout that includes various component regions, such as the exemplary devices of FIGS. 1-4. FIG. 5 shows an exemplary layout for device 200, including logic region 210, antenna regions 220 and 225, and charge pump area 230. The device 200 may have a length of from 1 to 25 mm², preferably 5 to 20 mm, a width of from 1 to 5 mm, preferably 1 to 3 mm, and an overall area of from 1 to 100 mm², preferably 10 to 50 mm². In one example, the device is 2 mm×12.5 mm. As will be discussed in more detail with regard to FIGS. 4A-4B, logic region 210 may further comprise an input/output control portion, a memory or information storage portion, a clock recovery portion, and/or an information/signal modulation portion.

Antenna region 220 is coupled to charge pump region 230 by L-shaped bus 222. A part of charge pump region 230 also overlaps with antenna region 225. Charge pump region 230 is conventionally coupled to antenna regions 220 and 225 by capacitors, diodes and/or interconnects. For example, charge pump region 230 may comprise a plurality of stages (in one specific example, 8 stages), and the capacitors therein may have an area of 100 to 400 square microns per antenna overlap portion (i.e., the portion of charge pump 230 that overlaps with either bus 222 or antenna region 225).

Figure 6B:
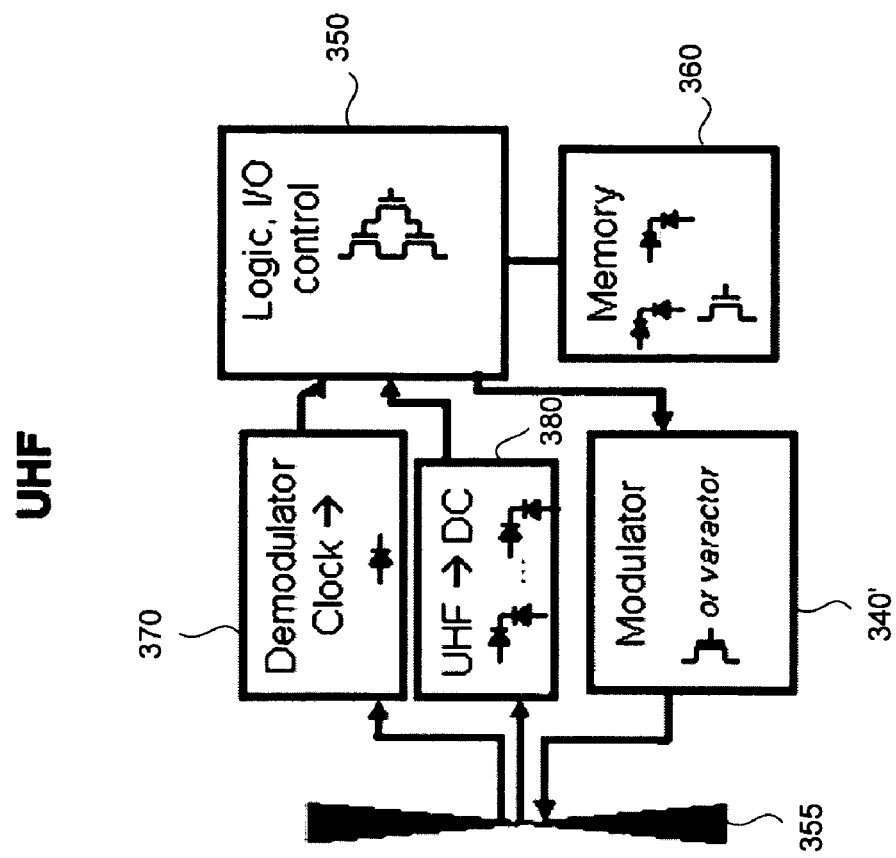
FIGS. 6A-B are block-level diagrams showing various functional blocks in embodiments of the present tags, for both high frequency (HF) and ultra high frequency (UHF) applications.
Figure 6A:
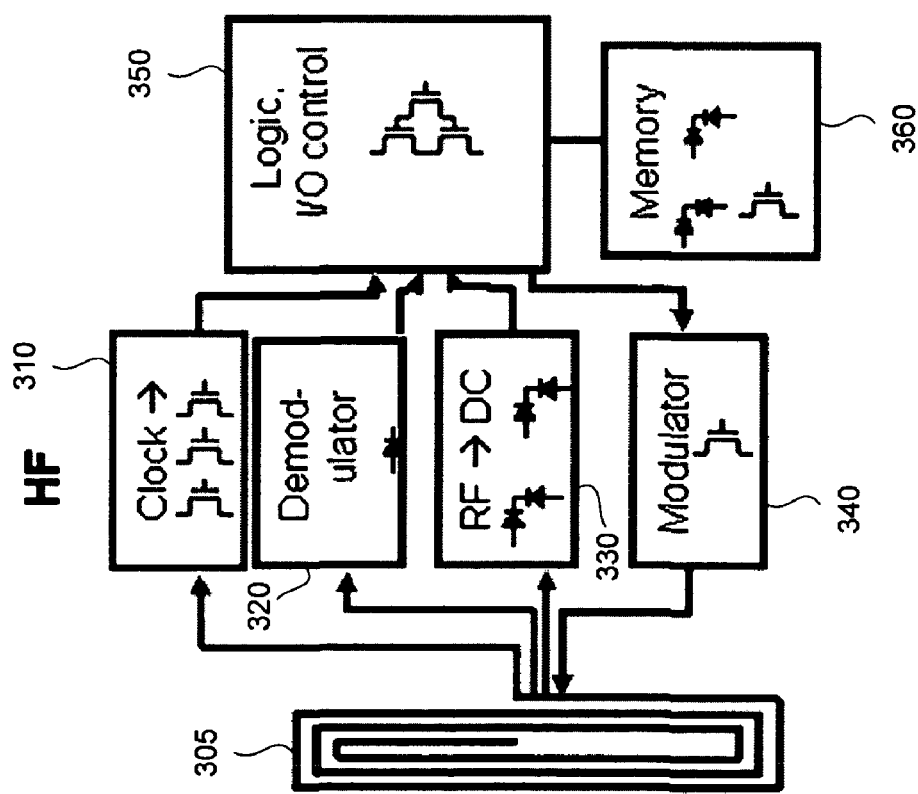

A block diagram of a HF tag design is shown in FIG. 6A and a UHF tag design is shown in FIG. 6B. The HF tag design comprises antenna 305, clock recovery block 310, demodulator block 320, RF-DC converter block 330, modulator block 340, logic and I/O control block 350, and memory 360. The UHF tag design comprises dipole antenna 355, demodulator/clock recovery block 370, UHF-DC converter block 380, modulator block 340', logic and I/O control block 350, and memory 360. Clock recovery block 310, antennae 305 and 355, and busses from the antennae to demodulator blocks 320 and 370 and to power converter blocks 330 and 380 operate at or near the carrier frequency, and therefore, require high speed devices.

These circuit blocks can be constructed from thin film device structures, including the following devices:

1. Antennae: at HF, this is most inexpensively fabricated as a planar spiral inductor coil with a resonant tank capacitor coupled thereto (e.g., in charge pump region 230 in FIG. 5). The low resistivity requirements for a high quality (high voltage/power extracting) LC coil necessitates the use of metal foils or thick printed films. In the UHF, the antenna is typically in a full or half-wave dipole or dipole-derivative form that supports transmission (and reception) of AC waves without significant DC conduction or long conduction distances as in a coil. Also, the skin depth of the excitation in the antennae is shallower in the UHF. For that reason, UHF antennae can be thin metal foils or even printed conductor films from materials such as Ag pastes. In certain design embodiments, the HF or UHF antennae could be formed directly in the underlying metal substrate for the integrated circuitry, or the substrate could form an interposer or strap (e.g., a thin plastic or glass sheet serving as a substrate for subsequent formation of silicon-based devices) of intermediate size (e.g., between that of the full antennae and that of the semiconductor device-containing integrated circuit area) that could then be attached to an external antennae.

2. RF-to-DC conversion: This function may be provided by rectifiers (typically in a voltage doubler configuration) at any applicable frequency, or from thin film diode structures formed from a silane-based ink at UHF or HF frequencies. At HF frequencies, it is also possible to use diode-connected TFTs (i.e., having its gate connected to a source or drain of the same transistor). Such thin film diodes and diode-connected TFTs can also be used for voltage clamps and/or voltage clamp circuits for DC conversion and/or output of DC voltage(s). Modeling of thin film devices based on silane ink-based layers with mobilities of >10 cm²/vs in the diode transport direction, doping in the range of $10^{17}$-$10^{20}$ cm$^{-3}$, and contact resistances on the order of $10^{-5}$ ohm-cm² can support rectification in the GHz regime, of sufficient efficiency to power a RFID circuit. GHz rectification to DC and <2 nsec gate delays have been demonstrated experimentally for a vertical thin film silane ink diode structure and a self-aligned TFT structure, respectively, formed as described herein.

3. Demodulator: Demodulation of clock and data signals, encoded as a subcarrier or subcarrier modulation on the carrier RF signal, can be achieved with simple voltage detectors based on thin film diodes or diode-connected TFTs as described elsewhere herein. Optimal signal extraction may require filtering and the use of tuned capacitors.

4. Logic to perform control and readout (I/O) functions can be realized with TFTs in CMOS or NMOS technologies, using materials as described herein. CMOS technology has a significant advantage in terms of power efficiency, but may require additional process steps compared to NMOS technology.

5. Memory: simple read-only memory (ROM) can be provided by a digital resistive network, defined during the fabrication process. One-time programmable (OTP) ROM may comprise a conventional fuse or anti-fuse structure, and nonvolatile EEPROM in thin film form may comprise a TFT having a floating gate therein. Programming and erasing circuitry (and devices configured to withstand programming and erasing voltages) can also be designed conventionally and manufactured as described herein.

6. Modulator: in the HF range, modulation is typically done by load modulation with a shunting transistor in parallel with a resonant capacitor (e.g., in the modulator block or formed from the same layer of material as the antenna; see, e.g., U.S. patent application Ser. Nos. 10/885,283 and 11/243,460, respectively filed on Jul. 6, 2004 and Oct. 3, 2005). With a modulator TFT manufactured from a silane-based ink in enhancement mode, when the transistor is on, the LC coil that forms the tag's antenna can be shorted. This dramatically reduces the Q of the circuit and the coupling to the reader coil. When the TFT is switched sufficiently "off," the Q of the LC coil is restored. In this way, a modulation signal can be passed from the tag to the reader. In the UHF range, similar effects also vary the scattering cross-section of the antenna and modulate the backscatter signal to the reader. This can be done with load modulation TFTs changing the impedance of the antenna, and therefore, the backscatter signal. Due to potential power losses associated with this technique, it may be advantageous to use a varactor-based modulation that shifts the imaginary part of the impedance of the UHF antennae using either a MOS capacitor device or a varactor diode that can be formed using the TFT and diode processes described herein for logic TFTs and for rectifier and/or demodulator diodes.

Layouts of thin film transistors configured for logic and memory have been designed in accordance with the present invention using 8 μm and 2 μm design rules. Under the 8 μm rules (assuming ±2 μm margin for registration/alignment variations), the average transistor area is 9776 μm², and one can place about 100 transistors per mm². Under the 2 μm rules, the average transistor area is 3264 μm², and one can place about 300 transistors per mm².

Typically, RFID tag operation is limited by the minimum RF field (and power) required to power the tag. Once the tag is able to power up and sustain the required voltages, tag-to-reader communications are possible.

EXAMPLES AND RESULTS

Using a process consistent with that described herein for making diodes, Schottky diodes having a titanium silicide contact layer were fabricated that are capable of rectification at >1 GHz. Prototypes of discrete RF front end circuits were manufactured, and the operation of such circuits at 900 MHz were also demonstrated. NMOS transistors having mobilities >50 cm$^2$/V-sec and as high as 100 cm$^2$ N-sec and PMOS transistors having mobilities>40 cm$^2$/V-sec were manufactured by such a process. CMOS inverters and oscillators were formed from interconnected transistors manufactured by such a process. The oscillators were capable of operation at 10-25 MHz. Stage delays of 10-1.1 ns were obtained between inverters in series (e.g., between stages of a ring oscillator). This demonstrates a maximum switching speed for logic from this process in excess of 950 MHz. These data, alone and/or in combination with other information (e.g., circuit block data and/or simulations) demonstrate that the present invention is capable of achieving UHF and HF RFID operation.

Figure 7:
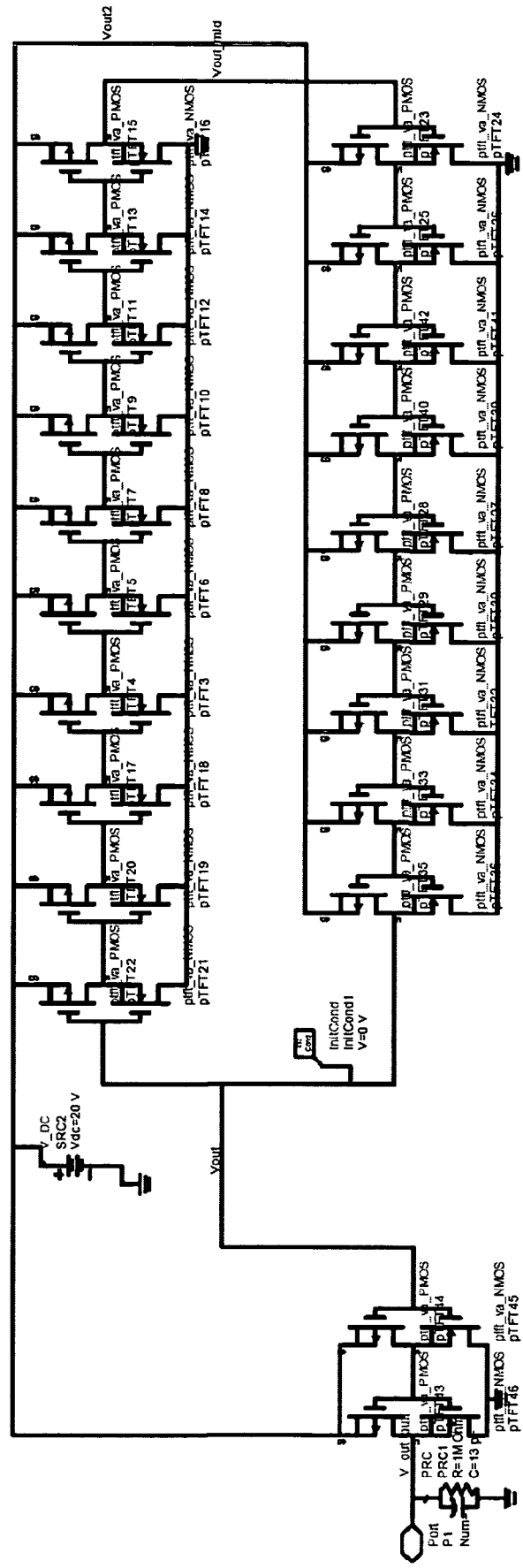
FIG. 7 is a circuit diagram showing an exemplary 19-stage oscillator demonstrating certain commercially acceptable properties for the present invention.

900 MHz SCHOTTKY DIODE PERFORMANCE. Schottky diodes manufactured according to the present invention (e.g., from a silicon ink) and having a titanium silicide contact layer ("Kovio Si diodes") had a power conversion efficiency>5% at 900 MHz; compare line 410 (the present invention) with line 420 (for an HSMS-8250 Schottky diode, commercially available from Agilent Technologies) in FIG. 7. Optimized process cleanliness should further improve this diode performance, for example by reducing leakage and short circuits.

Figure 8:
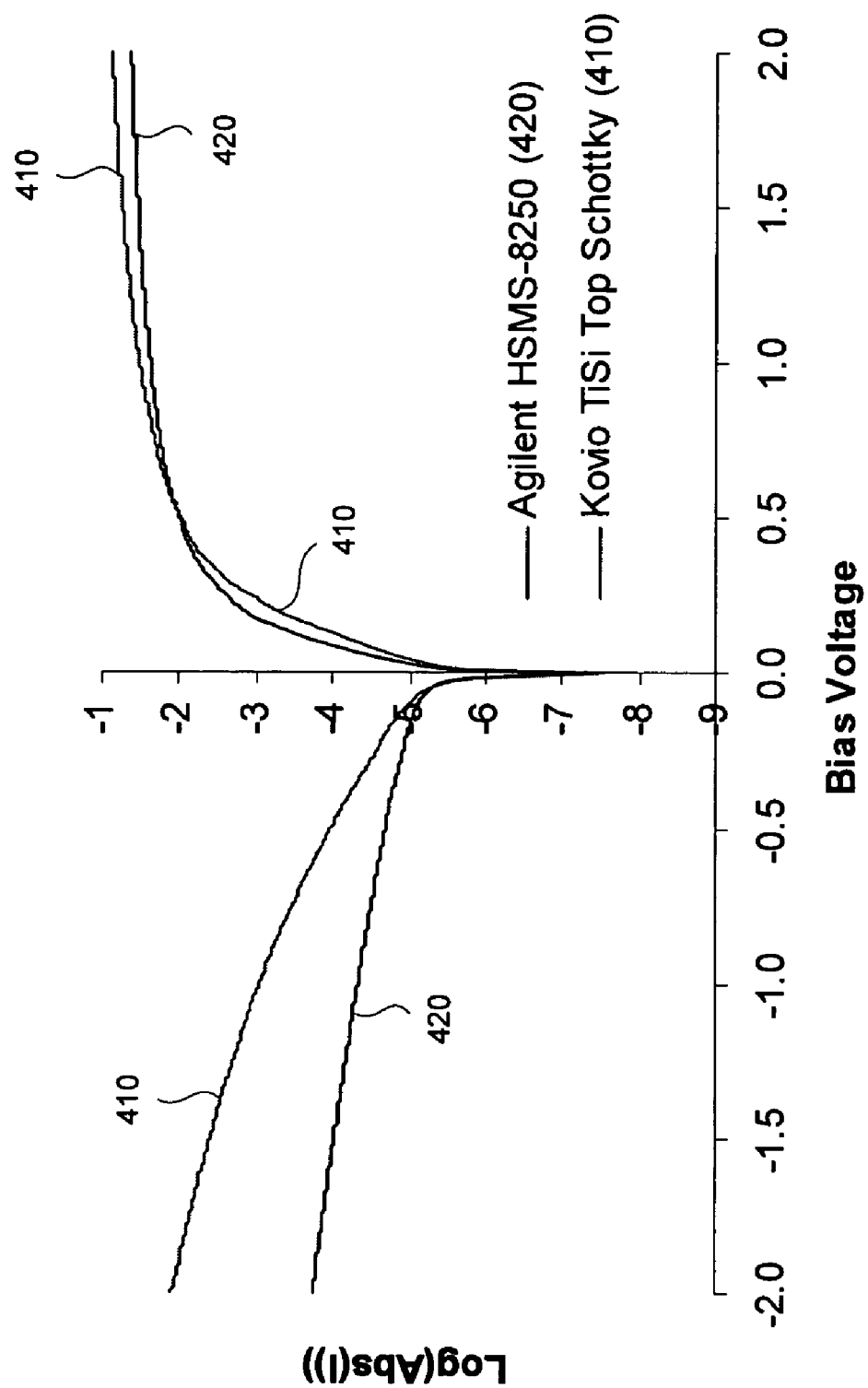
FIG. 8 is a graph comparing power conversion efficiencies for Schottky diodes manufactured according to the present invention with a commercially available Schottky diode.
Figure 9:
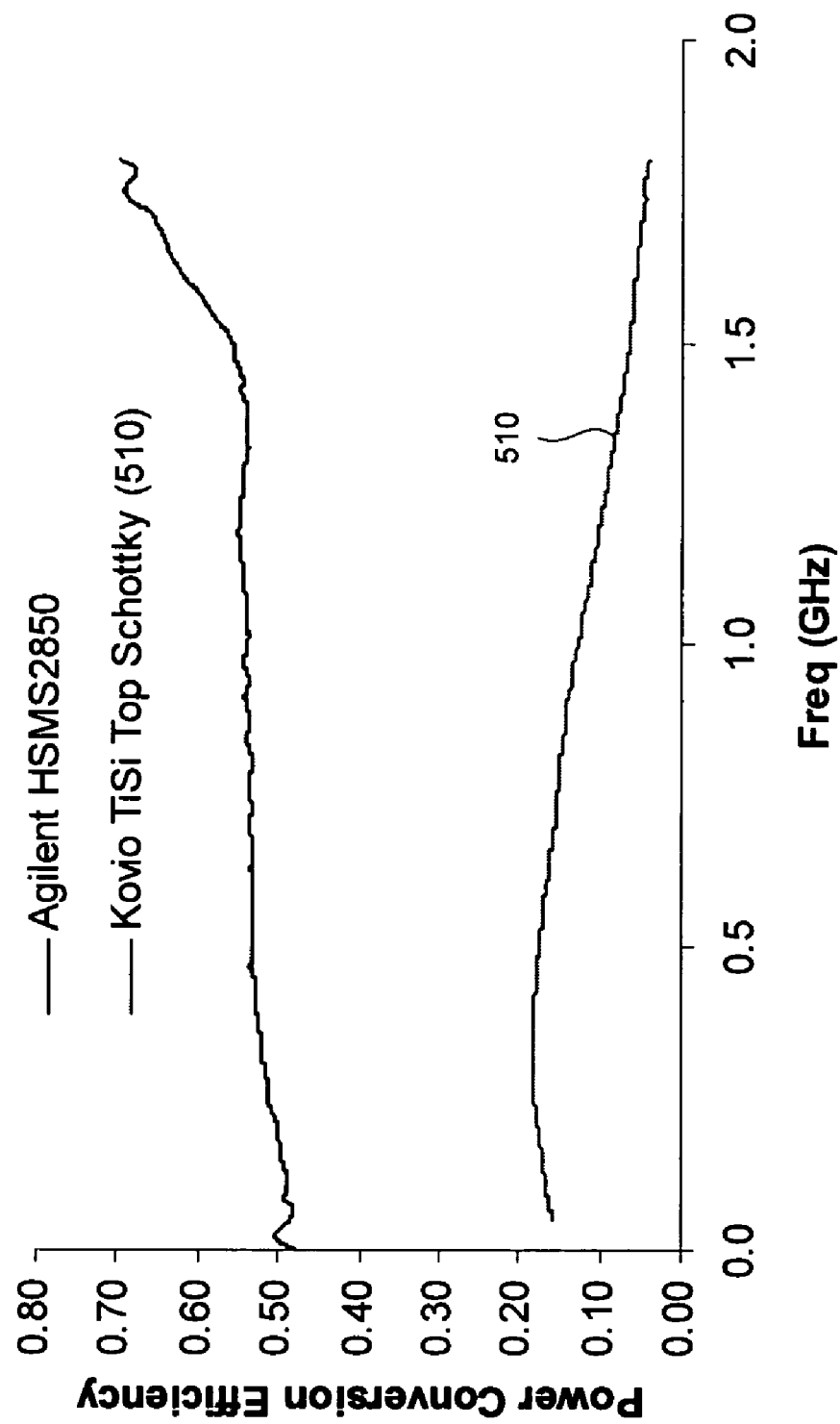
FIG. 9 is a graph demonstrating rectification up to GHz frequencies for single diodes manufactured according to the present invention.

RF FRONT END. As shown by line 510 in FIG. 8, GHz rectification between 10-20% for single diodes at 900 MHz has been demonstrated for diodes manufactured according to the present invention ("Kovio Si diodes"). Thus, diodes manufactured according to the present invention comprise working 900 MHz free space devices capable of generating DC power. Further optimization in manufacturing integration and circuit design should further improve the frequency response and rectification efficiency.

Using two such diodes in a UHF→DC rectifier block (see, e.g., block 380 in FIG. 6B), sufficient power was generated from a UHF source providing a 900 MHz carrier frequency signal in a prototype RFID tag equipped with a half dipole antenna to light an LED electrically coupled to a 100 mW reader (i.e., where the LED and reader effectively replace the logic and/or I/O control block 350 in the RFID tag of FIG. 6B).

Prototypes of functional front-end blocks (e.g., blocks 310-330 and 370-380) for a RFID tag having Schottky diodes manufactured according to the present invention have demonstrated properties shown in the following Table 1:

All four properties for the device(s) made using the "Si Ink+TiSi Top Schottky" process as shown in Table 1 above are commercially acceptable for item-level UHF tagging.

LOGIC SUMMARY. Data from prototype devices (e.g., MOS transistors) and circuits for logic and/or I/O control block 350 in FIGS. 4A-B manufactured using silicon ink as described herein (but which was used to make only prototype NMOS and PMOS TFTs) have shown>>1 MHz operational capability. This frequency of operation is sufficient for commercially acceptable UHF and HF RFID tags. Such silicon ink CMOS IC devices, when manufactured using a self aligned silicon ink TFT process flow (see, e.g., U.S. application Ser. No. 11/084,448, filed Mar. 18, 2005, incorporated herein by reference) have mobilities as high as 100 cm$^2$/V-sec, thereby verifying the suitability of the manufacturing process herein for commercial production of low-cost RFID tags. CMOS inverters manufactured using such a process flow are capable of MHz oscillation speeds (i.e., switching in less than 1 µsec). Furthermore, NMOS devices manufactured using such a process flow have threshold voltages suitable for commercially acceptable UHF and HF RFID tags.

Figure 10:
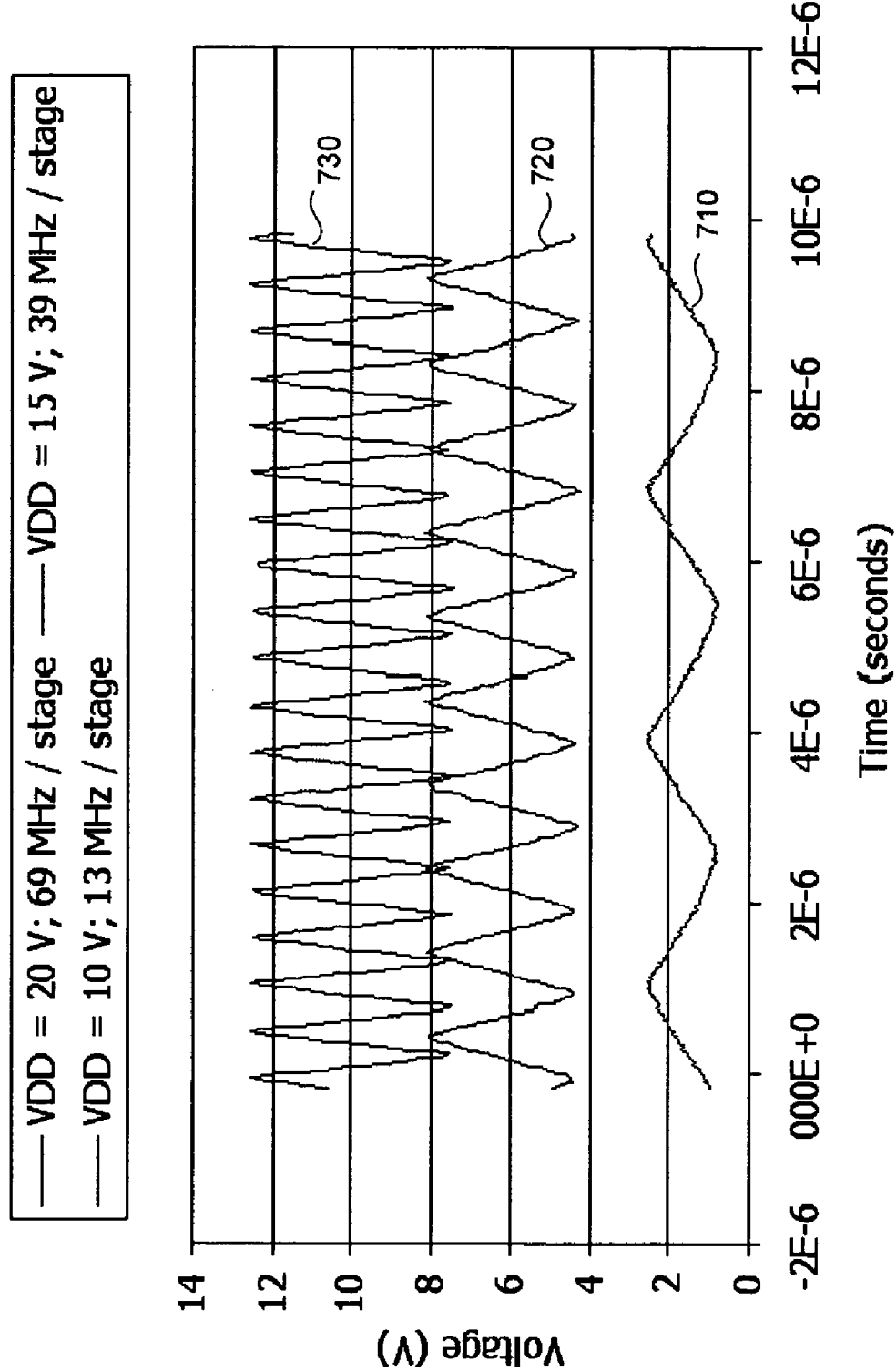
FIG. 10 shows results for the exemplary oscillator of FIG. 7 over a range of from 10 to 20 V.

SILICON INK CMOS OSCILLATOR RESULTS. A 19-stage ring oscillator 600 having the design shown in FIG. 7 was fabricated with 6 µm CMOS integrated TFT buffer stages 610a-610t. Stage delays were <0.1 msec at 10 V operation. FIG. 10 shows results for this exemplary oscillator over a range of from 10 to 20 V, including the effects of probe loading (the bottom plot 710 showing results for 10 V operation, the middle plot 720 showing results for 15 V operation, and the upper plot 730 showing results for 20 V operation). Thus, CMOS transistors manufactured using the silicon ink technology described in this application are feasible for UHF RFID logic (1-5 MHz) and HF RFID Logic (13.56 MHz). Very high speeds are possible for small channel devices (<10 nsec/stage for ~2 µm transistors operating at 10 V).

Figure 11:
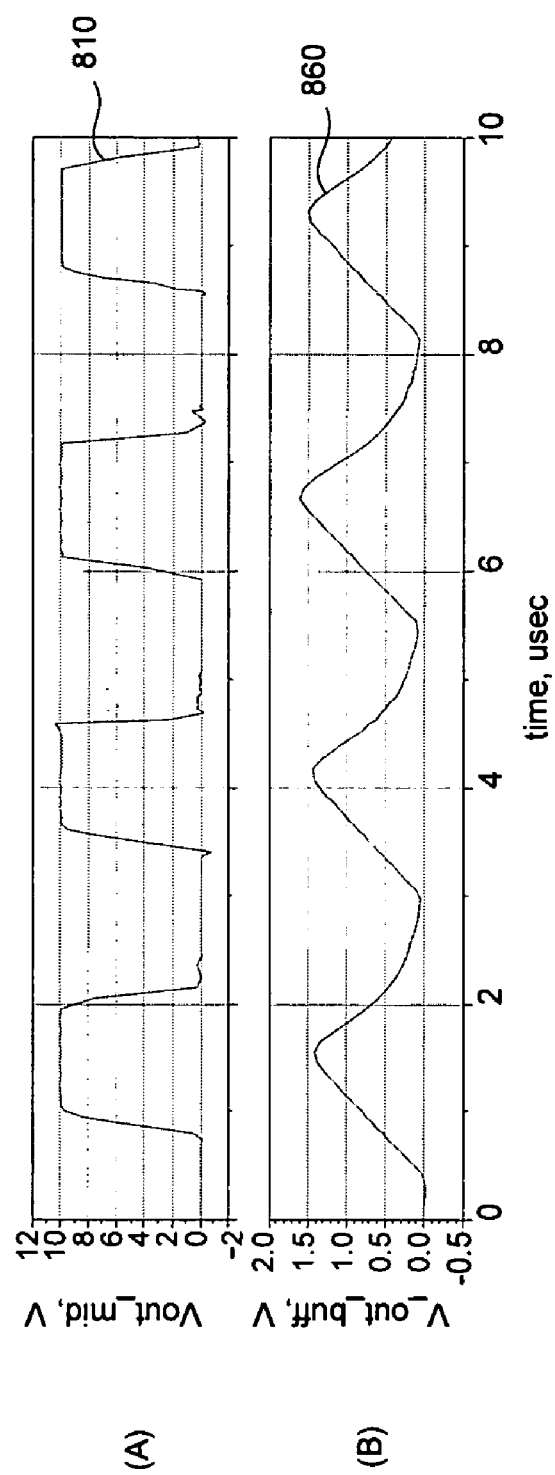
FIGS. 11A-11B show results of simulations for the exemplary oscillator of FIG. 7, both on-chip (FIG. 11A) and with oscilloscope buffer loading (FIG. 11B).
Figure 12B:
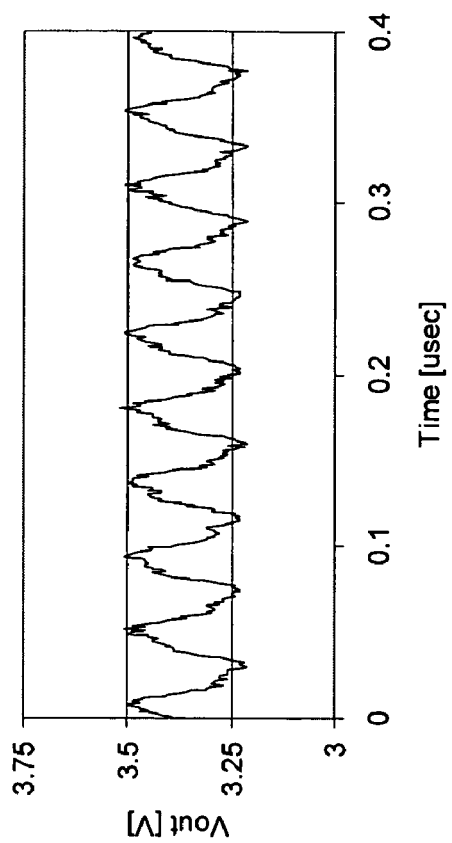
FIGS. 12A-12B are graphs demonstrating commercially acceptable switching speeds, stage delays, and NMOS transistor threshold voltages for the same devices as for FIG. 9, but having further undergone a post hydrogenation treatment.
Figure 12A:
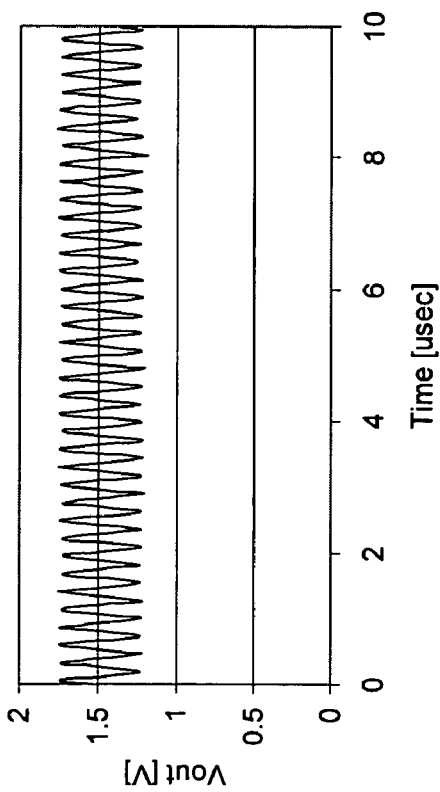

FIGS. 11A-11B show results of simulations for the exemplary 19-stage oscillator, both on-chip (FIG. 11A) and with oscilloscope buffer loading (FIG. 11B), at 10 V operation. The simulations used TFT model data extracted from the devices described above with regard to FIG. 8. The values in FIGS. 11A-11B compare the measured data for the logic (CMOS) devices above with the simulated data to validate extraction and measurement capabilities and further validate the demonstrated results. The oscillator was simulated using CMOS TFT buffer stages having transistors with a 6 µm effective length ($L_{eff}$=6 µm). The oscillation frequency was 350 kHz, with a stage delay of 70 ns. As one can tell, the shape of the plot 860 in FIG. 11B is quite similar to the shape of the plots in FIG. 8. The results in FIGS. 12A-12B and Table 2 below demonstrate commercially acceptable switching speeds ($f_{switch}$>10 MHz), stage delays ($t_d$<0.1 µsec), and NMOS transistor threshold voltages ($V_t$<0.5 V), for the same devices as for FIG. 8, but having further undergone a post hydrogenation treatment. The two curves of FIGS. 12A and 12B are respectively for ~6 micron and ~2 micron channel length CMOS TFT oscillators.

TABLE 1

RFID Front End Prototype Properties.

| Process | Si Ink + CoSi Top Schottky | Si Ink + TiSi Top Schottky |
|---|---|---|
| Ideality Factor | 1.75 | 1.5 |
| $I_o$ [nA] | 500 | 1300 |
| $R_s$ [Ω] | 101 | 19 |
| $R_{leak}$ [kΩ] | 60 | 5 |

TABLE 2

Properties for Oscillators of Graphs 12A-12B.

| Graph | 5A | 5B |
|---|---|---|
| $L_{eff}$ | 6 µm | 2 µm |
| $F_{osc}$ | 3.3 MHz | 25 MHz |
| $t_d$ | 8 nsec | 1.1 nsec |
| $F_{max}$ switch | 130 MHz | 950 MHz |

CONCLUSION/SUMMARY

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for manufacturing integrated circuitry, comprising:
   a) forming, from a first silicon-containing ink, a plurality of first semiconductor layer elements in a first pattern on a first surface of a dielectric layer, said dielectric layer on an electrically active substrate and said first semiconductor layer elements comprising a transistor channel region in a first region of the substrate, and a first diode layer element in a second region of the substrate;
   b) forming, from a second silicon-containing ink, a plurality of second semiconductor layer elements different from said first semiconductor layer elements in a second pattern on at least one of said first semiconductor layer element(s) and said first surface of said dielectric layer, said second semiconductor layer elements comprising a second semiconductor layer in the first region of the substrate and a second diode layer element in the second region of the substrate, wherein at least one of said first and second semiconductor layer element forming steps comprises printing the respective first and/or second silicon-containing ink; and
   c) forming a plurality of metal elements on or over said first semiconductor layer element(s) and said second semiconductor layer element(s), said metal elements comprising a metal contact and a metal gate in the first region of the substrate, and a diode contact in the second region of the substrate.

2. The method of claim 1, wherein said substrate comprises a metal foil.

3. The method of claim 2, further comprising, after said metal element forming step, the step of forming a circuit element from said metal foil.

4. The method of claim 2, further comprising, after said metal element forming step, the step of removing portions of the foil from under one or more circuit components having performance parameters adversely affected by parasitic capacitance.

5. The method of claim 1, wherein said plurality of first semiconductor layer elements further comprise at least one capacitor plates in a third region of the substrate and a plurality of first diode layers elements in the second region of the substrate.

6. The method of claim 1, wherein at least one of said first and second semiconductor layer element forming steps comprises inkjet printing a corresponding silicon-containing ink.

7. The method of claim 1, further comprising, before said metal element forming step, the step of growing an oxide on exposed surfaces of said first and second semiconductor layer elements.

8. The method of claim 1, further comprising, before said metal element forming step, the step of forming an interlayer dielectric on or over said first and second semiconductor layer elements.

9. The method of claim 8, further comprising, before said metal element forming step, the step of forming a plurality of openings in said interlayer dielectric to expose surfaces of at least some of said first and second semiconductor layer elements.

10. The method of claim 8, wherein the step of forming the interlayer dielectric comprises printing the interlayer dielectric on or over said first and second semiconductor layer elements.

11. The method of claim 1, further comprising, after said metal element forming step, the step of passivating said integrated circuitry.

12. The method of claim 1, wherein said plurality of first semiconductor layer elements comprises a plurality of first diode layers elements in the second region of the substrate and a plurality of said transistor channel regions in the first region of the substrate.

13. The method of claim 12, wherein said plurality of second semiconductor layer elements comprise (i) a plurality of second diode layer elements on said first diode layer elements and (ii) a plurality of said transistor source/drain terminals on said transistor channel regions.

14. A method for manufacturing integrated circuitry, comprising:
   a) printing, from a silicon-containing ink, a plurality of semiconductor layer elements in a pattern on a first surface of a dielectric layer, said dielectric layer on an electrically active substrate and said semiconductor layer elements comprising a transistor channel region in a first region of the substrate and a diode layer element in a second region of the substrate;
   b) forming a gate layer over the transistor channel region in the first region of the substrate;
   c) forming at least one dielectric layer on said gate layer, said diode layer element, and at least part of said first surface of said dielectric layer, said dielectric layer having openings for contacts to said gate layer and terminals of said plurality of semiconductor layer elements and
   d) printing at least one metal element on or over the semiconductor layer elements and on said gate layer, at least some of said metal elements comprising a diode contact in the second region of the substrate and electrically connecting a first one of said terminals with a second one of said terminals and/or one of said terminals with said gate layer in the first region of the substrate.

15. The method of claim 14, further comprising, after said gate layer forming step and before said dielectric layer forming step, forming source and drain terminals on or in said semiconductor layer element(s) forming the transistor channel region.

16. A method for manufacturing integrated circuitry for a radio frequency identification (RFID) device, comprising:
   a) forming, from a first semiconductor-containing ink, a plurality of first semiconductor layer elements in a first pattern on a first surface of a dielectric layer, said dielectric layer on an electrically active substrate and said first semiconductor layer elements comprising a transistor channel region in a first region of the substrate, and a first diode layer element in a second region of the substrate;
   b) forming, from a second semiconductor-containing ink, plurality of second semiconductor layer elements different from said first semiconductor layer elements in a second pattern on at least one of said first semiconductor layer element(s) and said first surface of said dielectric layer, said second semiconductor layer elements comprising a second semiconductor layer in the first region of the substrate and a second diode layer element in the second region of the substrate, wherein at least one of said first and second semiconductor layer element forming steps comprises printing the respective first and/or second silicon-containing ink; and c) forming a plurality of metal elements on or over of said first semiconductor layer element(s) and said second semiconductor layer element(s), said metal elements comprising a metal contact and a metal gate in the first region of the substrate, and a diode contact in the second region of the substrate.

17. A method for manufacturing integrated circuitry for a radio frequency identification (RFID) device, comprising:

a) printing, from a semiconductor-containing ink, a plurality of semiconductor layer elements in a pattern on a first surface of a dielectric layer, said dielectric layer on an electrically active substrate and said semiconductor layer elements comprising a transistor channel region in a first region of the substrate and a diode layer element in a second region of the substrate;

b) forming a gate layer over the transistor channel region in the first region of the substrate;

c) forming at least one dielectric layer on said gate layer, said diode layer element, and at least part of said first surface of said dielectric layer, said dielectric layer having openings for contacts to said gate layer and terminals of said plurality of semiconductor layer elements; and d) printing at least one metal element on or over the semiconductor layer elements and on said gate layer, at least some of said metal elements comprising a diode contact in the second region of the substrate and electrically connecting a first one of said terminals with a second one of said terminals and/or one of said terminals with said gate layer in the first region of the substrate.

18. A method of manufacturing integrated circuitry, comprising:

a) forming, from a first semiconductor-containing ink, a plurality of first semiconductor layer elements in a first pattern on a first surface of a dielectric layer, said dielectric layer on an electrically active substrate, and said first semiconductor layer elements comprising a transistor channel region in a first region of the substrate, a first diode layer element in a second region of the substrate, and a first capacitor plate in a third region of the substrate;

b) forming, from a second silicon-containing ink, a plurality of second semiconductor layer elements different from said first semiconductor layer elements in a second pattern on at least one of said first semiconductor layer element(s) and said first surface of said dielectric layer, said second semiconductor layer elements comprising a second semiconductor layer in the first region of the substrate and a second diode layer element in the second region of the substrate, wherein at least one of said first and second semiconductor layer element forming steps comprises printing the respective first and/or second silicon-containing ink; and c) forming a plurality of metal elements on or over said first semiconductor layer elements and said second semiconductor layer elements, said metal elements comprising a metal contact and a metal gate in the first region of the substrate, a diode contact in the second region of the substrate, and a second capacitor plate in the third region of the substrate.

19. The method of claim 18, further comprising, before forming said plurality of metal elements, growing an oxide on exposed surfaces of said first and second semiconductor layer elements.

20. The method of claim 18, further comprising, before forming said plurality of metal elements, forming a dielectric layer on or over said first and second semiconductor layer elements.

21. The method of claim 20, further comprising, before forming said plurality of metal elements, forming a plurality of openings in said dielectric layer to expose surfaces of at least some of said first and second semiconductor layer elements.

22. The method of claim 20, wherein forming the dielectric layer comprises printing the dielectric layer on or over said first and second semiconductor layer elements.

23. The method of claim 18, further comprising, after forming said plurality of metal elements passivating said integrated circuitry.

24. The method of claim 18, wherein printing said first semiconductor elements and said second semiconductor elements comprises inkjet printing a corresponding semiconductor-containing ink.

25. The method of claim 18, wherein said substrate comprises a metal foil.

26. The method of claim 18, wherein said plurality of first semiconductor layer elements comprise a plurality of capacitor plates and a plurality of first diode layer elements.

27. The method of claim 1, wherein said plurality of metal elements comprise a plurality of contacts and a plurality of metal gates.

28. The method of claim 1, wherein said plurality of first semiconductor layer elements further comprise a capacitor plate in a third region of the substrate and the metal elements further comprise a second capacitor plate in the third region of the substrate.

29. The method of claim 18, wherein said plurality of second semiconductor layer elements comprise (i) a plurality of second diode layer elements on said first diode layer elements and (ii) a plurality of said transistor channel regions on said first surface of said dielectric layer.

30. The method of claim 28, wherein said plurality of metal elements comprise a plurality of contacts and a plurality of capacitor plates.

31. The method of claim 29, further comprising forming, from a third silicon-containing ink different from said second silicon-containing ink, at least one third semiconductor layer element in a third pattern on at least one of said second semiconductor layer element(s) in the second region of the substrate, said third semiconductor layer element comprising at least one of a third diode layer element in the second region of the substrate and transistor source/drain terminals in the first region of the substrate.

32. The method of claim 29, wherein said plurality of metal elements comprise a plurality of contacts and a plurality of transistor gates.

33. The method of claim 32, further comprising doping the transistor source/drain terminals or MOS varactors by implant, solid source, plasma or vapor introduction of dopants into said source and drain regions or MOS varactors, self-aligned to the transistor gate.

* * * * *

UNITED STATES PATENT AND TRADEMARK OFFICE
CERTIFICATE OF CORRECTION

PATENT NO. : 7,687,327 B2  
APPLICATION NO. : 11/452108  
DATED : March 30, 2010  
INVENTOR(S) : James Montague Cleeves et al.

Page 1 of 1

It is certified that error appears in the above-identified patent and that said Letters Patent is hereby corrected as shown below:

IN THE CLAIMS

Claim 5, col. 15, line 58: change "plates" to --plate--.

Claim 5, col. 15, line 59: change "layers" to --layer--.

Claim 12, col. 16, line 19: change "layers" to --layer--.

Claim 16, col. 16, line 65: insert --a-- before "plurality of second semiconductor layer elements".

Claim 16, col. 17, line 9: change "on or over of said" to --on or over said--.

Signed and Sealed this  
Twentieth Day of March, 2012

David J. Kappos  
*Director of the United States Patent and Trademark Office*